(12) United States Patent
Imhoff et al.

(10) Patent No.: US 7,759,186 B2
(45) Date of Patent: Jul. 20, 2010

(54) METHOD FOR FABRICATING JUNCTION TERMINATION EXTENSION WITH FORMATION OF PHOTOSENSITIVE DOPANT MASK TO CONTROL DOPING PROFILE AND LATERAL WIDTH FOR HIGH-VOLTAGE ELECTRONIC DEVICES

(75) Inventors: Eugene A. Imhoff, Washington, DC (US); Francis J. Kub, Arnold, MD (US); Karl D. Hobart, Upper Marlboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 12/497,721

(22) Filed: Jul. 6, 2009

(65) Prior Publication Data

US 2010/0055882 A1     Mar. 4, 2010

Related U.S. Application Data

(60) Provisional application No. 61/093,738, filed on Sep. 3, 2008.

(51) Int. Cl.
*H01L 21/8238* (2006.01)
*H01L 21/336* (2006.01)
*H01L 21/265* (2006.01)

(52) U.S. Cl. ............... 438/212; 257/E21.058; 257/E29.066; 257/E21.059; 438/285; 438/518

(58) Field of Classification Search ......... 438/212, 438/285, 518, 519; 257/E21.058, E21.059, 257/E21.066, E29.066, E29.104, E29.257
See application file for complete search history.

(56) References Cited

U.S. PATENT DOCUMENTS

| | | | |
|---|---|---|---|
| 4,935,334 A * | 6/1990 | Boettiger et al. | ............ 430/322 |
| 6,002,159 A | 12/1999 | Bakowski et al. | |
| 6,215,168 B1 | 4/2001 | Brush et al. | |
| 6,525,296 B2 * | 2/2003 | Matsushima et al. | ... 219/121.69 |
| 7,026,650 B2 | 4/2006 | Ryu et al. | |
| 7,214,627 B2 | 5/2007 | Merrett et al. | |
| 2006/0134847 A1 * | 6/2006 | Tarui et al. | .................. 438/212 |

OTHER PUBLICATIONS

J.B.Fedison et al., "Electrical characteristics of 4.5 kV implanted anode 4H-SiC P-I-N junction rectifiers," IEEE Electron. Device Lett., vol. 22, No. 3, pp. 130-132 (2001).
Search Report and Written Opinion dated Oct. 29, 2009 in corresponding PCT application PCT/US2009/055645.

* cited by examiner

*Primary Examiner*—Walter L Lindsay, Jr.
(74) *Attorney, Agent, or Firm*—Amy Ressing; Joslyn Barritt

(57) ABSTRACT

Methods for producing a junction termination extension surrounding the edge of a cathode or anode junction in a semiconductor substrate, where the junction termination extension has a controlled arbitrary lateral doping profile and a controlled arbitrary lateral width, are provided. A photosensitive material is illuminated through a photomask having a pattern of opaque and clear spaces therein, the photomask being separated from the photosensitive material so that the light diffuses before striking the photosensitive material. After processing, the photosensitive material so exposed produces a laterally tapered implant mask. Dopants are introduced into the semiconductor material and follow a shape of the laterally tapered implant mask to create a controlled arbitrary lateral doping profile and a controlled lateral width in the junction termination extension in the semiconductor.

26 Claims, 7 Drawing Sheets

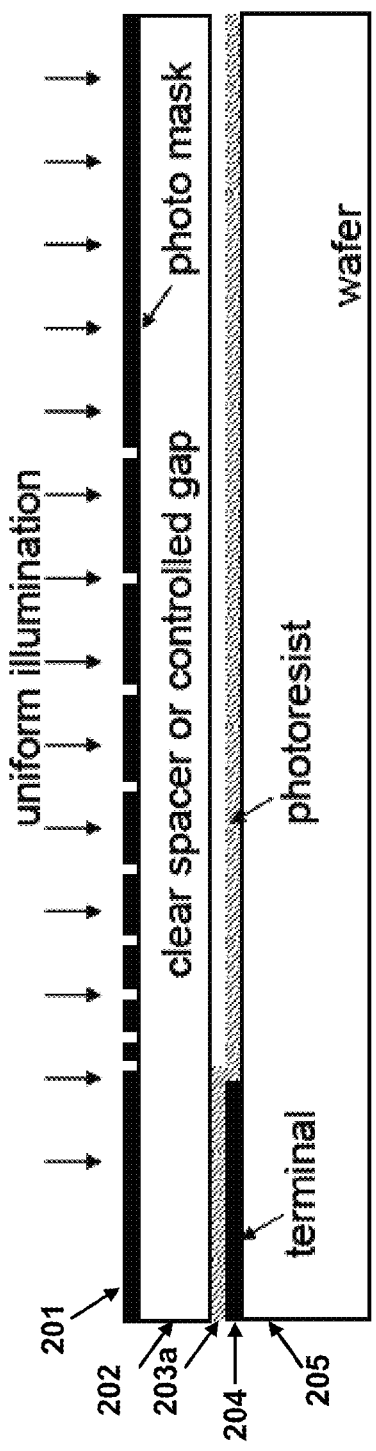
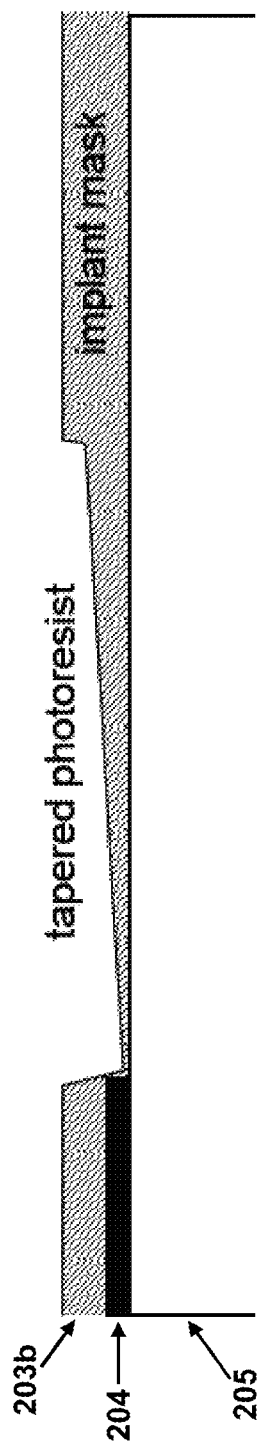
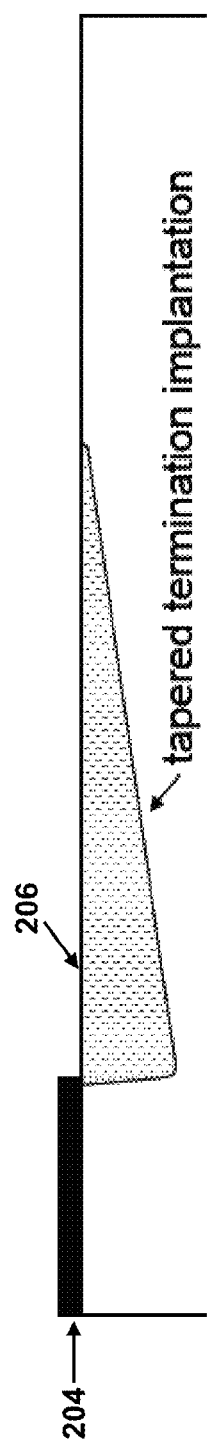
FIG. 2A
FIG. 2B
FIG. 2C

METHOD FOR FABRICATING JUNCTION TERMINATION EXTENSION WITH FORMATION OF PHOTOSENSITIVE DOPANT MASK TO CONTROL DOPING PROFILE AND LATERAL WIDTH FOR HIGH-VOLTAGE ELECTRONIC DEVICES

CROSS-REFERENCE

This application claims the benefit of priority based on U.S. Provisional Patent Application No. 61/093,738 filed on Sep. 3, 2008, the entirety of which is hereby incorporated by reference into the present application.

TECHNICAL FIELD

The present invention relates to semiconductor devices and semiconductor fabrication processes for high voltage applications.

BACKGROUND

Planar high-voltage semiconductor rectifier and switching devices typically require edge termination around the high-voltage terminal pn junction. In general the goal is to produce a smoothly tapered field profile to prevent high-voltage field-crowding that causes premature breakdown at the edge of the high voltage electrode. Without such a termination, the regions of high field curvature around the edges of the terminal reach the fundamental breakdown voltage far below the parallel plane limit. Such premature breakdown can be reduced somewhat by means of a field-plate or single-zone junction termination extension (JTE), but maximum performance is typically achieved through a more diffuse field profile in which the carrier concentration decreases with the distance from the high-voltage anode or cathode.

High-voltage junction terminations are commonly formed by creating a series of zones of progressively lower doping around the high-voltage anode or cathode. The doping is introduced by ion-implantation or diffusion through a blocking mask. In silicon, a highly effective planar termination technique involves use of a complex checkerboard implantation mask through which fine-scale islands of dopants are implanted into the silicon base. By reducing the ratio of the island size to the unimplanted area, a graded termination doping is achieved after diffusion. The surface field reduction achieved by this method is ideal since the doping is smoothly varying across the termination, and by specifying the mask design and implantation process, detailed control over the width and shape of the resulting doping profile in the edge termination can be achieved.

Silicon carbide (SiC) has become an increasingly popular semiconductor material for high-voltage devices due to its high breakdown electrical field and its relative insensitivity to high temperatures. However, dopants do not diffuse effectively in silicon carbide, and thus the dopant island-implantation technique that provides a smoothly graded junction termination doping profile in silicon does not work well.

Instead, in silicon carbide, fabrication of graded edge termination in high-voltage rectifiers and switches has generally been accomplished by using multi-zone or by floating guard ring methods. Both of these methods for producing graded junction termination extensions can result in excellent parallel-plate breakdown voltage, but both also have significant drawbacks.

In the multi-zone method, multiple zones of material having decreasing dopant levels are placed around the anode/cathode at the center of the device. The doped zones are electrically connected and overlap to provide a continuously stepped doping profile from the center of the device to the edge. However, fabrication of a graded junction termination extension using this method requires multiple doping steps, and therefore can be expensive, both in terms of time and money. In addition, each transition between the stepped regions is a potential breakdown point due to differences in doping levels and differences in voltage in each zone, and at high voltages (i.e., higher than 2.4 kV), these differences can result in a complete breakdown of the device.

The floating guard ring method utilizes a tightly graded series of micron-scale doped rings to create an approximation of a continuous doping profile. Although this method can produce a graded junction termination in one doping step, it requires the use of a very precise doping mask and high-resolution photolithography, and therefore can be even more expensive than the multi-zone method.

Thus, the established techniques for producing a graded junction termination extension can be expensive and/or complicated. Furthermore, performance of these techniques often suffers because of the existence of high electric fields in the transition between doping zones. Simpler, less costly, and more effective methods are widely sought, but to date these solutions are limited in the lateral width of the termination region, are limited in the lateral field profile that can be achieved across the region, and/or are limited in the tone of the photoresist that can be used.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides methods for producing a junction termination extension surrounding the edge of a cathode or anode junction, where the junction termination extension has a controlled arbitrary lateral doping profile and a controlled arbitrary lateral width. In accordance with the present invention, a laterally tapered material such as a photosensitive polymer material having a controlled arbitrary lateral thickness profile is prepared, and the laterally tapered photosensitive polymer material is used to produce a junction termination extension having a controlled arbitrary lateral doping profile and a controlled arbitrary lateral width in a semiconductor such as silicon carbide. The present invention also provides methods for preparing a laterally tapered material that can be used to produce a junction termination extension having a controlled arbitrary lateral doping profile and a controlled arbitrary lateral width in a semiconductor.

BRIEF DESCRIPTION OF THE DRAWINGS

FIGS. 2A-2C are block drawings depicting aspects of an exemplary embodiment of a junction termination extension having a controlled arbitrary lateral doping profile and a controlled arbitrary lateral width in accordance with the present invention.

DETAILED DESCRIPTION

The invention summarized above can be embodied in various forms. The following description shows, by way of illustration, combinations and configurations in which the aspects can be practiced. It is understood that the described aspects and/or embodiments of the invention are merely examples. It is also understood that one skilled in the art may utilize other aspects and/or embodiments or make structural and functional modifications without departing from the scope of the present disclosure.

For example, although a laterally tapered implant mask or laterally tapered material in accordance with the present invention is often described as comprising a photoresist, it should readily be appreciated that other materials such as a polyimide, polymer, graphite, carbon, diamond-like carbon, amorphous silicon carbide, silicon oxide, silicon nitride, metal, tungsten, gold, or nickel can be used where suitable, and that such alternative embodiments are within the scope of the present disclosure.

The present invention provides methods for producing a junction termination extension having a controlled arbitrary lateral doping profile and controlled arbitrary lateral width surrounding the edge of a cathode or anode junction. The invention achieves such a controlled arbitrary lateral doping profile and a controlled arbitrary lateral width in the junction termination extension by providing a laterally tapered implant mask which is then used to control the doping profile in a semiconductor substrate such as a silicon carbide wafer.

In one exemplary embodiment of the present invention, dopants can be implanted through the laterally tapered implant mask to produce junction termination extension having a controlled arbitrary lateral doping profile and a controlled arbitrary lateral width in the semiconductor.

In other embodiments, the laterally tapered dopant mask can comprise a diffusion mask, wherein dopant atoms can be diffused through the diffusion mask into the semiconductor substrate to produce a controlled arbitrary lateral doping profile in the semiconductor.

In another exemplary embodiment, a laterally tapered material and the semiconductor material can be simultaneously etched to translate the laterally tapered material into the semiconductor and produce a junction termination extension having a controlled arbitrary lateral doping profile and a controlled arbitrary lateral width in the semiconductor. In this embodiment, the dopants in the tapered material that previously were introduced into the semiconductor through a broad-area epitaxial, implantation, or diffusion step, are thus modulated by the grayscale etching profile.

These and other aspects of the present invention are described in more detail below.

Figure 1A:
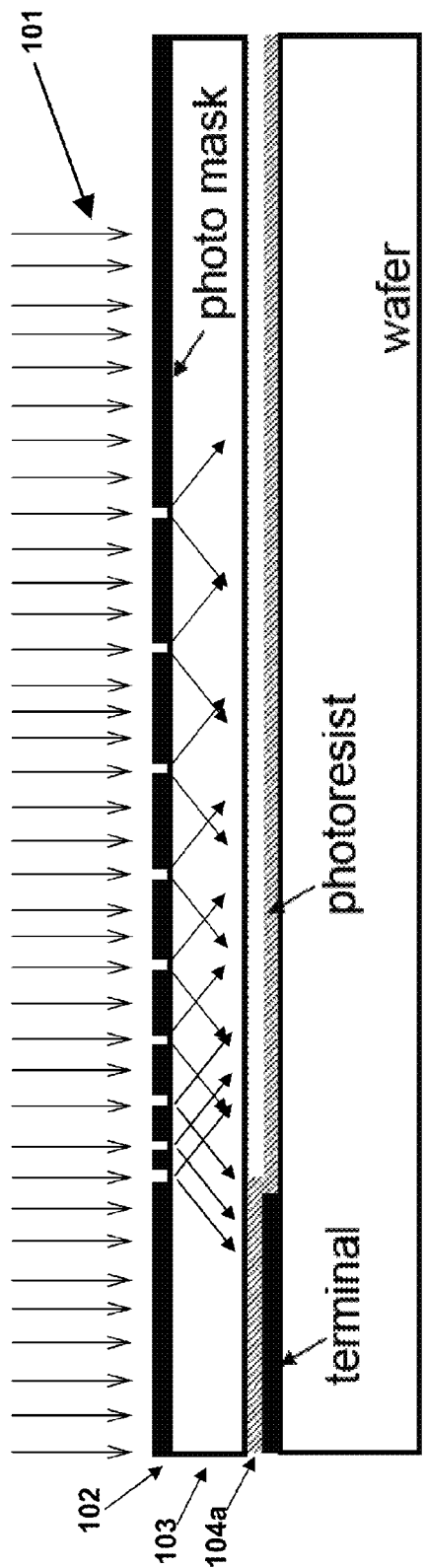
FIGS. 1A and 1B are block drawing depicting aspects of an exemplary embodiment of a tapered doping mask in accordance with the present invention.
Figure 1B:
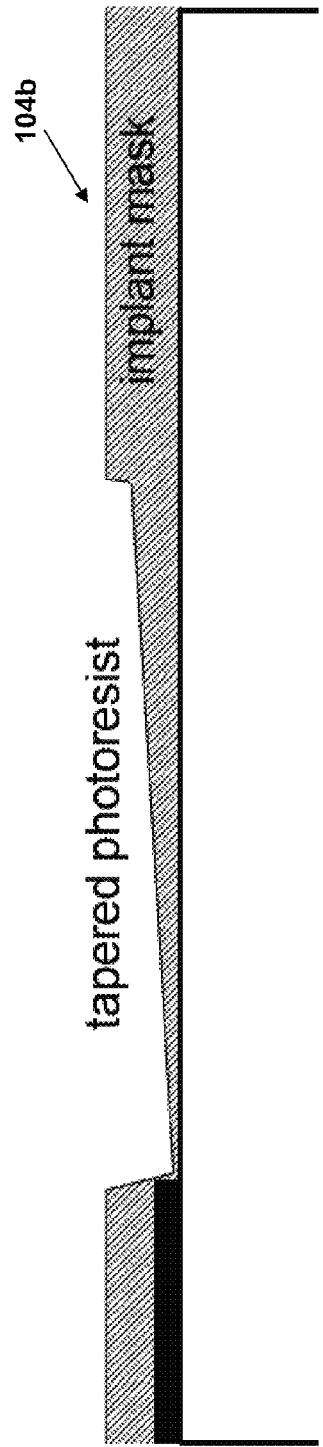

FIGS. 1A and 1B depict aspects of an exemplary embodiment of an implant mask that can be used in a method for producing a junction termination extension having a controlled arbitrary lateral doping profile and a controlled arbitrary lateral width in accordance with the present invention.

As illustrated in FIG. 1A and as described in more detail below, in accordance with the present invention, a tapered grayscale implant mask can be fabricated using a specially designed photomask 102 and a photosensitive material such as photoresist 104a. In the exemplary embodiment illustrated in FIG. 1A, photomask 102 is designed as an opaque mask having a series of clear openings distributed along the length thereof, with the openings being increasingly separated along the length of photomask 102 to form a pattern of opaque and clear areas. Light 101, which can include ultraviolet, violet, or blue light, shines onto photomask 102 and through the openings. Photomask 102 is separated from photoresist 104a by a clear spacer or controlled gap 103, and as the light shines through the openings, it diffuses as it hits photoresist 104a to illuminate portions of photoresist 104a not directly beneath the openings, with the portions of photoresist 104a adjacent more closely-spaced openings receiving more incident light than the portions where the openings are farther apart. In this way, a light flux image of the mask is projected onto the photoresist in an unresolved manner, obscuring the fine details of the opaque and clear areas of the mask pattern. By carefully designing the spacing of the openings, a continuous grayscale illumination of photoresist 104a can be achieved. When processed, for example as described below, such an illuminated photoresist 104a can be formed into a tapered grayscale implant mask such as implant mask 104b shown in FIG. 1B.

In accordance with the present invention, such a grayscale tapered implant mask can be used to produce a junction termination extension having a controlled arbitrary lateral doping profile and a controlled arbitrary lateral width.

In some embodiments, aspects of which are illustrated in FIGS. 2A-2C and 3A-3C, dopant atoms can be implanted through an implant mask comprising a laterally tapered material to produce a junction termination extension having a controlled arbitrary lateral doping profile and controlled arbitrary lateral width. In the exemplary embodiment illustrated in FIGS. 2A-2C, photoresist 203a is deposited on a semiconductor wafer 205, with an anode or cathode terminal 204 formed on the upper surface of semiconductor wafer 205, e.g. by epitaxial deposition, within the photoresist layer 203a. Photomask 201 is separated from photoresist 203a by a clear spacer or gap of a controlled width 202. As described briefly above, photomask 201 is subjected to uniform illumination to create tapered photoresist implant mask 203b from photoresist 203a, as shown in FIG. 2B. As seen in FIG. 2B, tapered photoresist implant mask 203b has a thin portion at the end where it was subjected to the greatest illumination and becomes continuously thicker along its length as the light incident on the photoresist decreased, until it reaches a point where no light penetrated the photomask and thus the photoresist is at its thickest. In exemplary embodiment illustrated in FIG. 2B, this thickest portion has the form of a "step" representing a discrete change in thickness, but as can readily be appreciated, it is possible for the thickness of the photoresist to increase in a smooth continuous manner along most or all of its length.

In accordance with this first embodiment, dopant atoms can be implanted into semiconductor wafer substrate 205 through implant mask 203b. The types of atoms that are typically implanted into the semiconductor wafer include aluminum, boron, nitrogen, gallium, phosphorous, arsenic, or antimony ions, but any other suitable atoms also can be implanted. Implantation can be accomplished by bombarding the surface of the material with the desired ions, accelerated to one or more high energies, typically kilo- or mega-electron-volts. During implantation, the thicker portion of the laterally tapered material stops more of the ion implant dopants within the laterally tapered material so that a smaller dopant density gets implanted in the semiconductor, whereas the thinner portion of the laterally tapered implant mask stops fewer of the dopants from being implanted, resulting in a higher dopant density in the semiconductor. Thus, as illustrated in FIG. 2C, the depth of implantation is modulated by the shape of the taper of the implant mask. In some embodiments, ion implantation can be performed at a plurality of energies and doses to produce an approximately uniform lateral doping profile in the semiconductor, whereas in other embodiments, the ion implantation can be performed at a plurality of energies and doses to produce an approximately uniform lateral doping profile in the semiconductor.

In some cases, dopant atoms are implanted through a laterally tapered material at an ion implantation temperature less than approximately 200 C, and in such cases, the photoresist 203a can be used directly as implant mask 203b.

However, it is sometimes desirable to perform the ion implantation at temperatures higher than 200 C in order to anneal any damage to the semiconductor wafer that may have occurred during the ion implantation operation. Although photoresist materials are excellent implant masking materials for low temperature implantation, they are not suitable as an implant mask for implantation temperatures greater than approximately 200 C. Suitable material for use as a laterally tapered implant mask for such high temperature implantation can include graphite, carbon, diamond-like carbon, amorphous silicon carbide, silicon oxide, silicon nitride, and metals, such as tungsten, gold, or nickel.

In some such high-temperature embodiments, a laterally tapered implant mask comprising graphite or other carbon materials can be obtained by annealing the wafer with the photosensitive material (photoresist or photosensitive polyimide) in a low oxygen concentration ambient such as vacuum, nitrogen or argon at temperatures at greater than approximately 500 C to convert the photosensitive material into graphite or carbon. In other such embodiments, a laterally tapered implant mask of a high-temperature suitable material such as diamond-like carbon, amorphous silicon carbide, silicon oxide, silicon nitride, metal, tungsten, gold, or nickel can be obtained by first producing the laterally tapered photosensitive polymer material in a manner described above and then transferring the lateral thickness profile into the high temperature suitable material by simultaneously etching the laterally tapered photosensitive material and the high temperature suitable material. The tapered profile can also be transferred into another material such as a dielectric, semiconductor, or another polymer that can perform the same tapered masking function. The taper thickness can be amplified by this process by choosing a material that has a faster etch-rate than the tapered mask resulting from the photoresist process or reduced by choosing a material that has a slower etch-rate than the tapered mask.

The method can also include transferring a pattern of the etching mask into another material before etching the existing dopant layer on the semiconductor substrate, for instance, transferring the tapered mask pattern into a dielectric layer such as silicon dioxide, then using the tapered dielectric layer as an etch mask for the semiconductor.

Figure 3A:
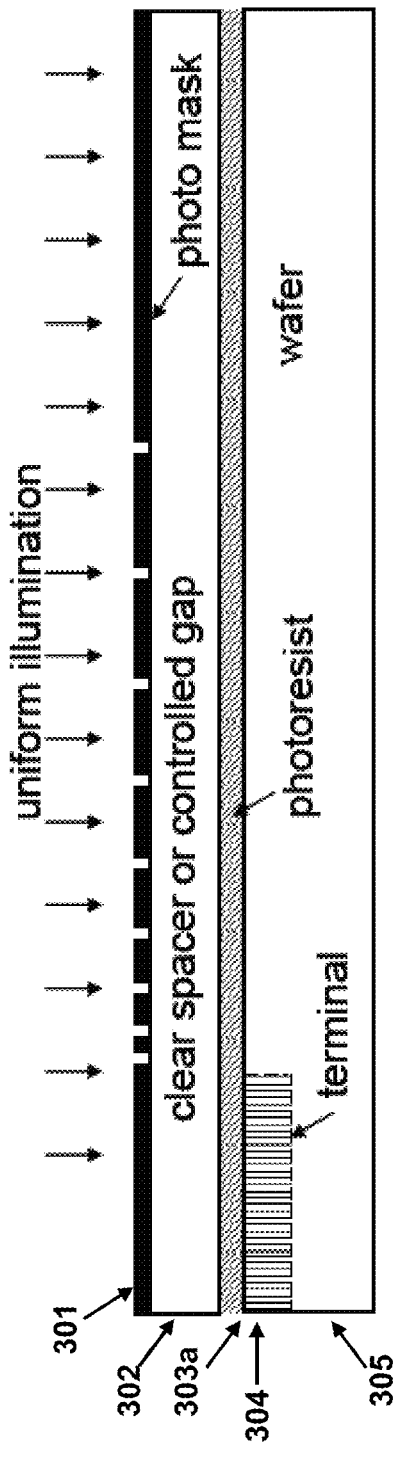
FIGS. 3A-3C are block drawings depicting aspects of another exemplary embodiment of a junction termination extension having a controlled arbitrary lateral doping profile and a controlled arbitrary lateral width in accordance with the present invention.
Figure 3B:
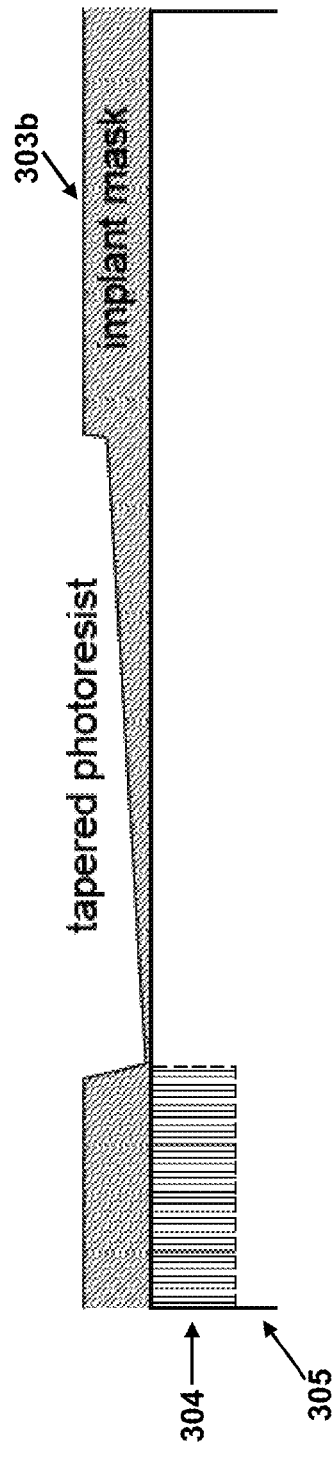
Figure 3C:
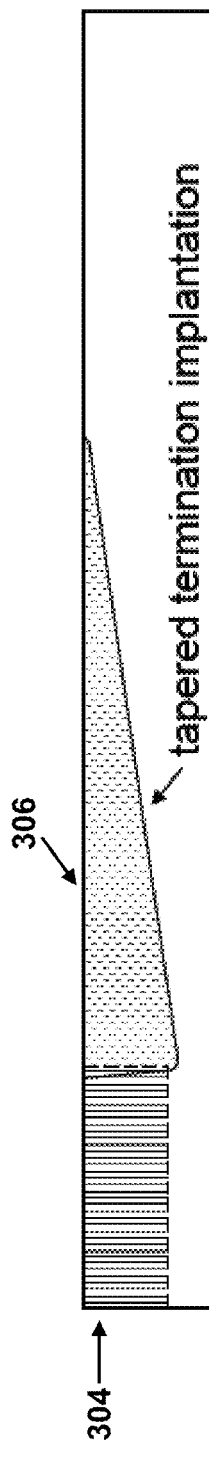

FIGS. 3A-3C illustrate an alternative configuration for this first exemplary embodiment of a junction termination extension comprising a doped semiconductor wafer, the junction termination extension having a controlled arbitrary lateral doping profile and a controlled arbitrary lateral width in accordance with the present invention. As seen in FIGS. 3A and 3B and as described above, a tapered implant mask 303b can be produced by illuminating a photomask 301 so that the light diffused through clear spacer 302 strikes photoresist 303a disposed on a surface of semiconductor wafer 305 with continuously decreasing intensity along a length thereof. In contrast to the configuration shown in FIGS. 2A and 2B, in the configuration shown in FIGS. 3A-3C, terminal 304 is not on top of a surface of the semiconductor wafer 305, but instead is embedded within it, as might be found in a device with patterned implant terminals. Production of implant mask 303b shown in FIG. 3B and implantation of dopant atoms proceeds as described above with respect to FIGS. 2A-2C, and as seen in FIGS. 3B and 3C, a tapered extension termination adjacent terminal 304 within semiconductor substrate 305 can be produced.

This exemplary embodiment of a method for producing a junction termination extension having a controlled arbitrary lateral doping profile and controlled arbitrary lateral width in a semiconductor wafer by implanting dopants through an implant mask of a laterally tapered carbon or graphite material may be further illustrated by the steps described in the following Example 1.

EXAMPLE 1

1. Use a specially designed mask, separated from the photoresist by a controlled gap or clear spacer, to produce a laterally tapered photoresist layer having controlled arbitrary lateral thickness profile and a controlled arbitrary lateral width on the semiconductor substrate in the junction termination extension region surrounding the high voltage junction.

2. Develop and bake the photoresist, using any conventional methods for developing a photoresist, such as immersion in a commercially available development solution for a time on the order of 1 minute followed by baking with a 120 degree Celsius oven or hotplate.

3. Optionally convert the photoresist to graphite (or carbon) by heating at approximately greater than 500 C in a nitrogen or argon ambient. The resist will flow and smooth out to some degree during the heating.

4. Perform a dopant ion implantation (for example, P-type dopant such as boron or aluminum) at a selected ion implant energy and dose into the semiconductor substrate having the laterally varying thickness graphite layer on the surface so that some of the ion implant dopant is stopped (resides) within the graphite layer and some of the dopant is stopped in the semiconductor (for example, N-type semiconductor).

In this manner, a junction termination extension having a controlled arbitrary lateral doping profile and a controlled arbitrary lateral width is obtained in the semiconductor. Additional steps that can be taken include depositing a material capping layer, annealing implants, depositing passivation layers, forming a contact window, and defining metal electrodes. These steps are known in the art and will not be described in detail here.

An alternative embodiment of a method for producing a junction termination extension having a controlled arbitrary lateral doping profile and a controlled arbitrary lateral width using a tapered implant mask comprising a high-temperature suitable material includes forming a laterally tapered photosensitive polymer material on top of a high-temperature suitable material such as silicon oxide, and then using a reactive ion etcher (RIE) to simultaneously etch the photosensitive polymer and high temperature suitable material. Typically, the etch rate of the photoresist and silicon oxide layer will be at different rates, but for optimized etch gases, RF power, and pressure in the RIE, nearly equal etch rates for the photoresist and silicon oxide in the RIE can be obtained. Equal etch rates are not required but can be desirable to ensure that a selected lateral variation in thickness of silicon oxide implant mask to be obtained.

Figure 4A:
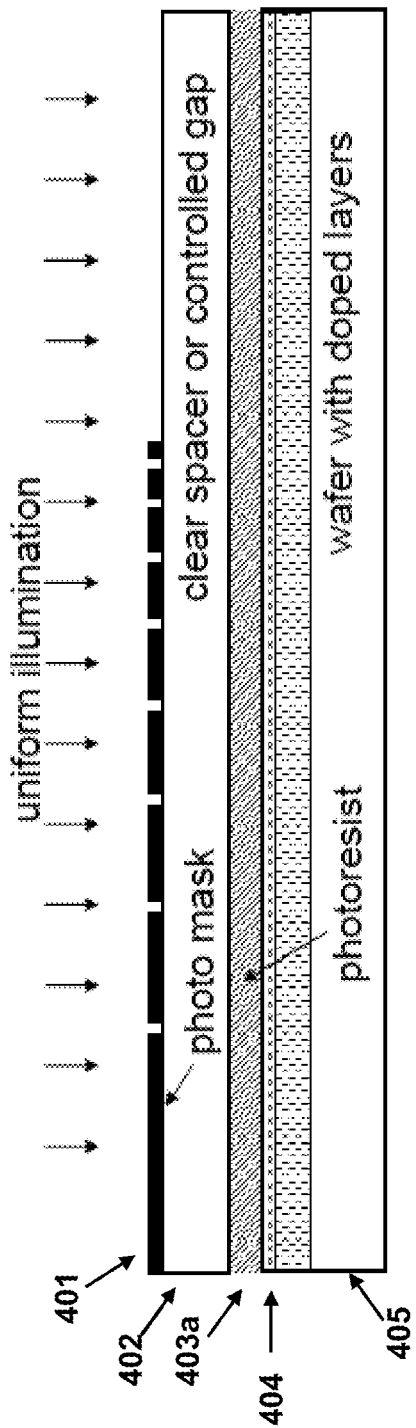
FIGS. 4A-4C are block drawings depicting aspects of an additional exemplary embodiment of a junction termination extension having a controlled arbitrary lateral doping profile and a controlled arbitrary lateral width in accordance with the present invention.
Figure 4B:
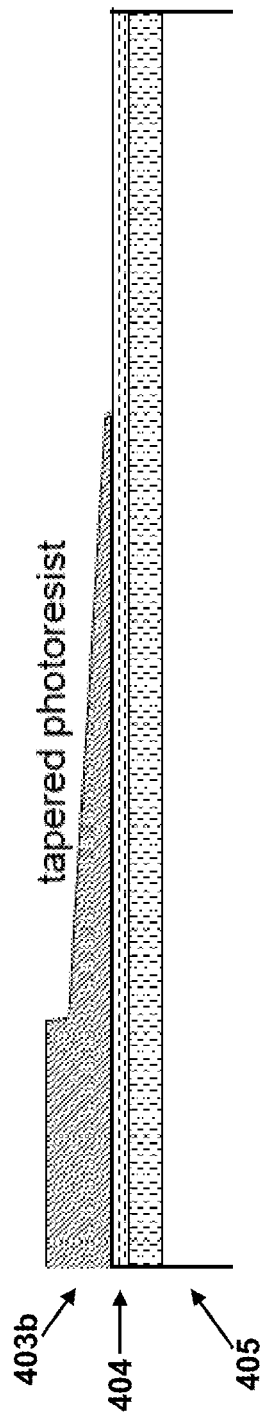
Figure 4C:
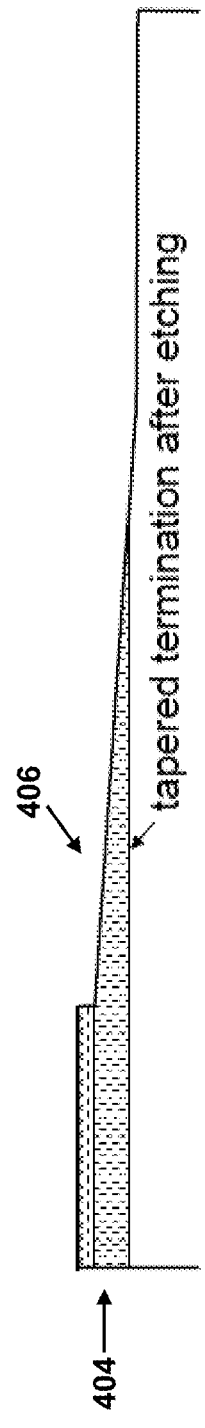

Aspects of this alternative embodiment are illustrated in FIGS. 4A-4C. As shown in FIG. 4C, in a manner similar as with the previously described embodiments, a photomask 401 is placed above a photoresist layer 403a and separated from photoresist layer 403a by a clear spacer of controlled gap 402. In this alternative embodiment, photoresist layer 403a is disposed on a semiconductor wafer 405 which as one or more doped layers 404 already deposited thereon. Similar to the manner for creating a laterally tapered photoresist described above, photomask 401 is subjected to a uniform illumination and photoresist layer 403a receives light through the slits in photomask 401 in a nonuniform manner as described above, with the portion of the photoresist situated below the more closely spaced slits receiving more light than the portion of the photoresist situated below the slits spaced farther apart. Photoresist 403a is then developed and baked to form a tapered photoresist 403b having a controlled arbitrary lateral thickness profile and controlled arbitrary lateral width. Then, in a manner such as that described above, laterally tapered photoresist 403b and silicon wafer 405 having doped layers 404 deposited thereon can be simultaneously etched using, for example, an RIE etcher. The result is a continuously tapered doped junction termination 406 disposed on the semiconductor wafer as shown in FIG. 4C.

This alternative embodiment may be further illustrated by the exemplary steps described in the following Example 2.

EXAMPLE 2

1. Form a dopant layer in a semiconductor.
2. Use a specially designed mask, separated from the photoresist by a controlled gap or clear spacer, to produce a laterally tapered photoresist layer having a controlled arbitrary lateral thickness profile and a controlled arbitrary lateral width on the semiconductor substrate in the junction termination extension region surrounding the high voltage junction.
3. Develop and bake the photoresist.
4. Optionally convert the photoresist to graphite (or carbon) by heating at approximately greater than 500 C in a nitrogen or argon ambient. The resist will flow and smooth out to some degree during the heating.
5. Use an RIE etcher to simultaneously etch laterally tapered material (for example, photoresist) and the semiconductor material. Typically, the etch rate of the laterally tapered material and the semiconductor material will be at different rates, but for optimized etch gases, RF power, and pressure in the RIE, nearly equal etch rates for the laterally tapered material and semiconductor material can be obtained. Equal etch rates are not required but can be desirable to obtain a dopant layer in the semiconductor material having a controlled arbitrary lateral doping profile and a controlled lateral width.

The tapered profile can also be transferred into another material (dielectric, semiconductor, or another polymer) that can perform the same tapered masking function. The taper thickness can be amplified by this process by choosing a material that has a faster etch-rate than the tapered mask resulting from the photoresist process or reduced by choosing a material that has a slower etch-rate than the tapered mask.

Additional steps that can be taken include depositing a material capping layer, annealing implants, depositing passivation layers, forming a contact window, and defining metal electrodes. These steps are known in the art and will not be described in detail here.

Still another alternative process can include producing a laterally tapered photosensitive polymer material having an approximate laterally tapered profile and a controlled arbitrary lateral width on the semiconductor substrate, transferring this approximate profile to a second material layer such as silicon oxide by simultaneously etching the photosensitive polymer material and the material layer and then transferring the approximate laterally tapered profile to the dopant layer in the semiconductor by simultaneously etching the material layer and the semiconductor material.

Figure 5A:
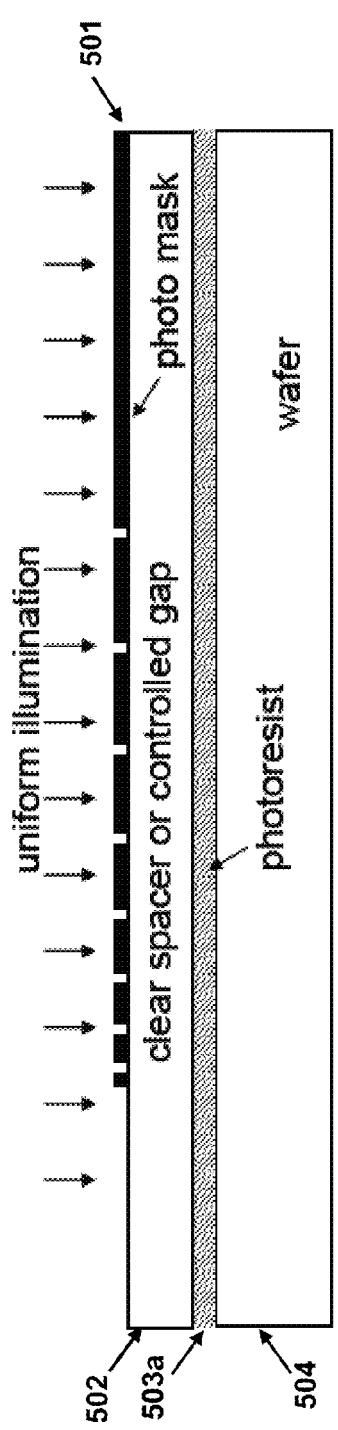
FIGS. 5A-5C are block drawings depicting aspects of an further exemplary embodiment of a junction termination extension having a controlled arbitrary lateral doping profile and a controlled arbitrary lateral width in accordance with the present invention.
Figure 5B:
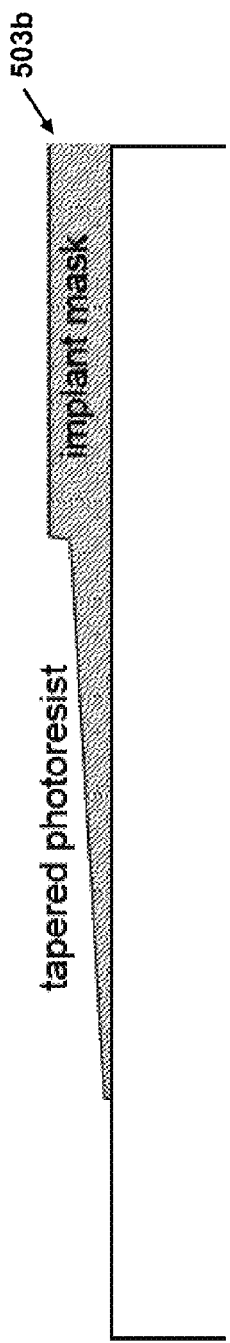
Figure 5C:
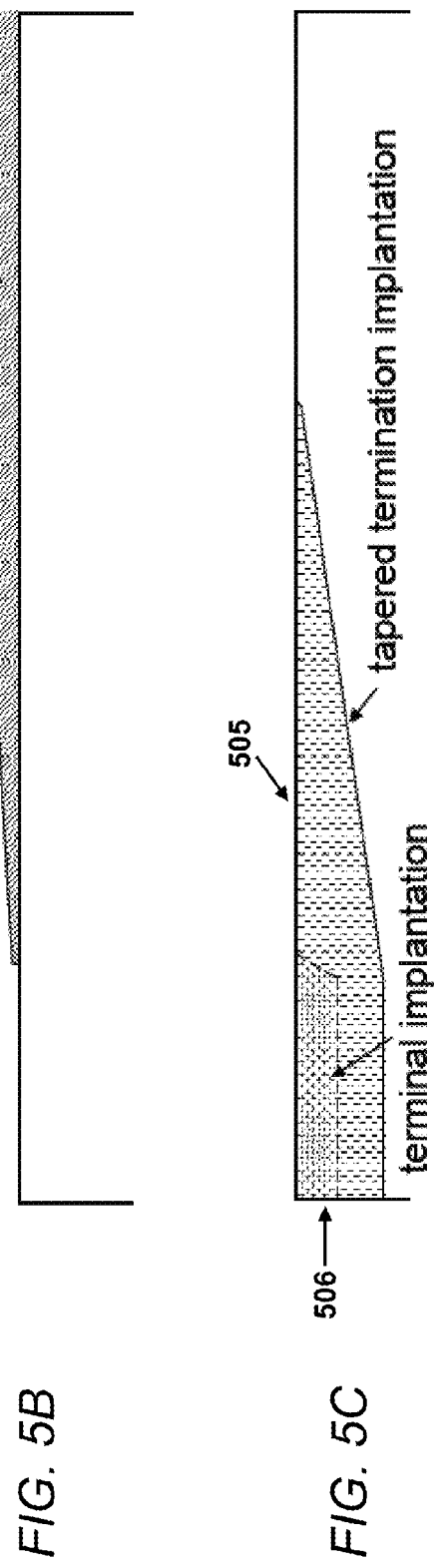

In another embodiment, the methods of the present invention can be used to create laterally tapered doping profiles that produce a self-aligned contact or transition during the same photolithography step that produces the junction termination extension. An example of this embodiment is shown in FIGS. 5A-5C. As illustrated in FIG. 5A, a photoresist 503a is disposed on a semiconductor wafer 504 and is separated from photomask 501 by a clear spacer or gap 502. Photomask 501 is illuminated and photoresist 502 is etched in a tapered fashion in a manner described above to form a tapered implant mask 503b shown in FIG. 5B. Implant mask 503b is then used to produce a tapered termination implantation doping profile 505 in the semiconductor wafer as shown in FIG. 5C. If implantation or diffusion is used, the dopant species and/or process conditions can be chosen to produce a high doping level in the regions where the photoresist is completely removed (or is very thin), and a lower doping level where the dopants are blocked by the thicker regions of the taper. If etching is employed, then the terminal contact area with pre-existing high doping material can be protected by the full thickness of the photoresist while a tapered region around the contact area is etched into the surface doped material.

Aspects of the present invention also provide methods for making a laterally tapered implant mask for producing a controlled arbitrary lateral doping profile having a controlled arbitrary lateral width in a semiconductor wafer. As described below, these methods include using a two-tone photomask that can produce a controlled arbitrary lateral profile of light flux to the photoresist (or photosensitive polymer such as polyimide) in a region extending laterally from the edge of a high voltage junction (typically an anode or cathode junction) on the semiconductor substrate.

In general, as illustrated in FIGS. 1A-1C described above, a method for making a laterally tapered implant mask includes the steps of deposing a photosensitive material onto a semiconductor substrate; exposing the photosensitive material to uniform light through a mask having a mask pattern of opaque and clear areas, a light flux image produced by the mask pattern being projected onto the photosensitive material in an unresolved manner to obscure fine details in the opaque and clear areas of the mask pattern and provide a controlled laterally tapered profile and a controlled lateral width of light flux onto the photosensitive material; and developing the photosensitive material in a solution wherein the photosensitive material dissolves at a rate proportional to the amount of light flux absorbed during the exposure to produce a laterally tapered implant mask having a controlled arbitrary lateral thickness profile and a controlled arbitrary lateral width corresponding to the controlled laterally tapered profile and the controlled lateral width of light flux onto the photosensitive material.

Exemplary embodiments of these general steps are described in more detail below.

A first exemplary embodiment of a method for making a laterally tapered implant mask in accordance with the present invention includes the steps of (1) designing a two-tone mask with clear openings in an opaque mask that allow some light through the mask, with the spacing between adjacent clear openings selected to have monotonically increasing opaque spacing between the adjacent clear openings; and (2) rigidly holding the mask at a fixed mask-to-wafer separation by means of an ultraviolet-transparent spacer material or by means of a proximity lithography tool with a selectable mask to wafer separation to defocus (blur) the light that transmits through the clear openings (i.e., expose the photoresist in an optically unresolved manner), with the more closely spaced clear openings between adjacent clear openings producing more defocused optical flux into the positive photoresist and so producing thinner positive resist on the wafer after development of the photoresist, and the more widely spaced clear openings between adjacent clear openings producing less defocused optical flux into the positive photoresist and so producing thicker positive resist on the wafer after photoresist development, the light flux from the most widely separated clear openings overlapping in the photoresist.

In this first exemplary embodiment, the monotonically increasing opaque spacing between adjacent clear openings can be selected by such algorithms as geometric increasing opaque spacing between adjacent clear openings or some other functional relationship A second exemplary embodiment of a method for making a laterally tapered implant mask in accordance with the present invention uses a reduction mask aligner along with a two-tone mask and includes the steps of (1) designing a two-tone mask comprising an opaque mask having multiple zones at increasing lateral separations from an anode or cathode edge, each zone having a different density of approximately equally distributed clear openings to allow light to pass therethrough, the overall density of openings in the mask decreasing monotonically with a distance from the anode or cathode edge; and (2) using the two-tone mask in combination with a reduction mask aligner, with the clear openings in the mask producing sub-resolution regions of optical flux in the positive resist on the semiconductor substrate (i.e., exposing the photoresist in an optically unresolved manner), the light flux from the clear openings within a zone overlapping in the photoresist, with the zones having the higher density of clear openings producing more defocused optical flux into the positive photoresist and thinner positive resist on the wafer after development of the photoresist, and the zones having the lower density of clear openings producing less defocused optical flux into the positive photoresist and thicker positive resist on the wafer after photoresist development.

In this second exemplary embodiment, the monotonically decreasing clear opening density can be selected by such algorithms as linear decrease in clear opening density geometric or some other functional relationship.

A third exemplary embodiment of a method for making a laterally tapered implant mask in accordance with the present invention uses an ultraviolet-transparent spacer material or a proximity lithography tool with a selectable mask to wafer separation and includes the steps of (1) designing a two-tone mask comprising an opaque mask having multiple zones at increasing lateral separations from an anode or cathode edge, each zone having a different density of approximately equally distributed clear openings to allow light to pass therethrough, the overall density of openings in the mask decreasing monotonically with a distance from the anode or cathode edge; and (2) rigidly holding the mask at a fixed mask-to-wafer separation by means of a ultraviolet-transparent spacer material or by means of a proximity lithography tool with a selectable mask-to-wafer separation to defocus (blur) the light transmitted through the clear openings (i.e., expose the photoresist in an optically unresolved manner), the light flux from the clear openings within a zone overlapping in the photoresist, with the zones having the higher density of clear openings producing more defocused optical flux into the positive photoresist and thinner positive resist on the wafer after development of the photoresist, and the zones having the lower density of clear openings producing less defocused optical flux into the positive photoresist and thicker positive resist on the wafer after photoresist development.

As with the second exemplary embodiment, in this third exemplary embodiment, the monotonically decreasing clear opening density can be selected by such algorithms as linear decrease in clear opening density geometric or some other functional relationship.

A fourth exemplary embodiment of a method for making a laterally tapered implant mask in accordance with the present invention also uses an ultraviolet-transparent spacer material or a proximity lithography tool with a selectable mask to wafer separation along with a two-tone mask, and includes the steps of (1) designing a two-tone mask wherein the mask pattern comprises radial clear openings with the spacing and/or the width of the clear openings adjusted from the inner edge to the outer edge of the junction termination extension region; and (2) rigidly holding the mask at a fixed mask-to-wafer separation by means of a ultraviolet-transparent spacer material or by means of a proximity lithography tool with a selectable mask to wafer separation to defocus (blur) the light transmitted through the clear openings (i.e., expose the photoresist in an optically unresolved manner), the light flux from the clear openings within a zone overlapping in the photoresist, with the zones having the higher density of clear openings producing more defocused optical flux into the positive photoresist and thinner positive resist on the wafer after development of the photoresist, and the zones having the lower density of clear openings producing less defocused optical flux into the positive photoresist and thicker positive resist on the wafer after photoresist development.

In each of these four exemplary embodiments, the method can further include the steps of (3) developing the photoresist in a solution; (4) baking the photoresist to desorb solvents in the photoresist; (5) optionally bake the photoresist to flow the photoresist to smooth the surface topography of the photoresist; and (6) optionally annealing the photoresist in an inert ambient such as nitrogen or argon to convert the resist to a carbon material (also known as a graphite material).

In all of these embodiments, the photoresist can be positive or negative in character, with the spacings in a negative photoresist being appropriately inverted from the spacings in a positive one. All of these embodiments provide a controlled lateral profile of light flux to the positive (or negative) photoresist resulting in a controlled arbitrary and controlled lateral tapered profile positive photoresist layer after development of the photoresist and if an optional anneal is performed, a controlled arbitrary and controlled lateral tapered carbon material profile.

An additional alternative method of producing a controlled arbitrary lateral profile of light flux to the photoresist (or photosensitive polymer such as polyimide) in a region extending laterally from the edge of a high voltage junction (typically an anode or cathode junction) on the semiconductor substrate is to use an analog grayscale mask. Such an analog grayscale mask could then be used to produce a laterally tapered photoresist and so produce a junction termination extension having a controlled arbitrary laterally tapered doping profile and controlled arbitrary lateral width using any of the methods described herein.

EXAMPLE

Creation of a junction termination extension having a controlled arbitrary lateral doping profile and a controlled arbitrary lateral width using a gray-scale lithography technique and tapered implantation mask having one or more features described herein is now described in the context of the following example.

The lithography technique and implantation mask were implemented in all-implanted silicon carbide pn junction diodes. The starting material was 38 μm of n-doped ($7\times10^{14}$ $cm^{-3}$) epitaxy grown on top of an n+ buffer layer on an 8° off-axis 4H—SiC substrate. After creating alignment features with reactive ion etching, a thick layer of positive photoresist was spin-deposited on the wafer.

The tapered implantation mask was formed using a grayscale lithography technique. Grayscale exposure was accomplished by using a two-tone sub-resolution mask. In this exemplary implementation, the mask had circular diode anode openings that were 100 μm in diameter. Around the anodes were termination regions consisting of a series of geometric features, with a gradually increasing ratio between the opaque and open areas. At the outer edge of the termination region, the mask was opaque. Upon exposure from a contact aligner or proximity aligner, the light from adjacent termination openings overlapped on the wafer, resulting in a smoothly tapered exposure of the photoresist. Two different spacing algorithms were used for the termination profile, resulting in photoresist taper shapes that were convex or concave compared to a linear taper. Six different termination widths were defined for each design, extending from 100 to 500 μm from the outer edge of the 100 μm anode.

Figure 6:
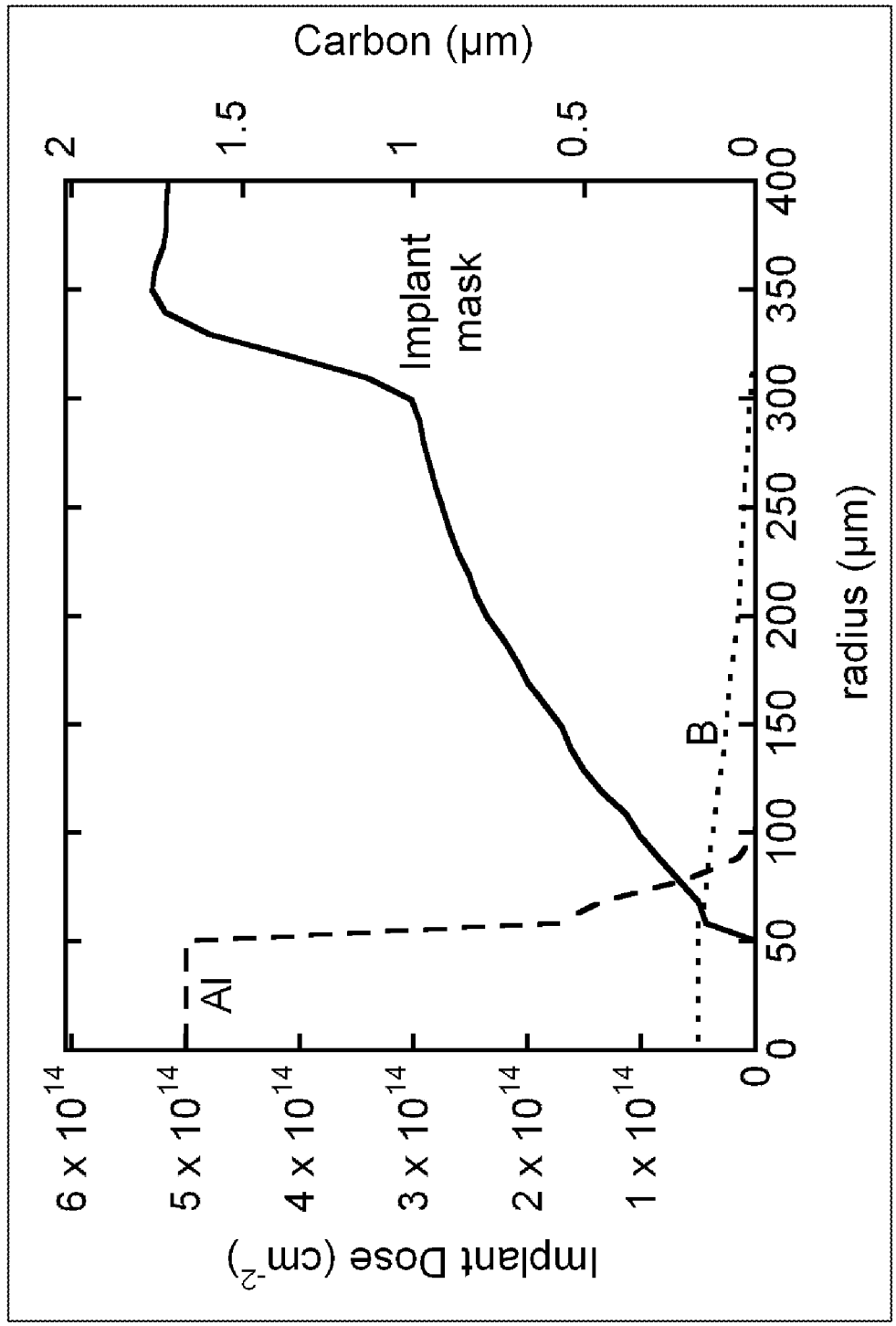
FIG. 6 is a plot showing an actual carbon profile and projected implant profiles in an exemplary implementation of a gray-scale lithography technique and tapered implantation mask in accordance with the present invention.

Since the implantation mask needed to survive a high-temperature implant, the tapered photoresist was converted to carbon at 650° C. in a nitrogen ambient atmosphere. The resulting carbon thickness was ~1.6 μm in the planar regions, 70-75% thinner than the photoresist. In the termination regions, the carbon mask stepped down to 1 μm at the outer edge of the termination and then smoothly tapered down to 0.15 μm at the inner edge of the pattern. An example of an actual carbon profile and the projected implant profiles is shown in FIG. 6. The designed convex and concave shapes of the taper were little affected by the carbonization process; if anything the thermal cycle smoothed out any roughness or small imperfections in the original photoresist pattern. No change in the anode or termination diameter was seen.

Two quarters of the same wafer were implanted in this exemplary implementation. The implantation consisted of deep boron for the termination and shallow aluminum for a self-aligned anode. Confirmation by SIMS of the stopping power of the carbon for both dopants was critical for the design. Both the boron and aluminum implants were performed at 650° C. and were box profiles. The maximum energy was 270 keV for the boron implant and 90 keV for the aluminum implant. The aluminum energy was chosen to be low enough to be blocked by the carbon and had a total dose of $5\times10^{14}$ $cm^{-2}$. By contrast, the boron energy easily penetrated through the tapered carbon out to near the thickest part of the taper but then was blocked by the thicker carbon layer in the planar regions beyond. In this manner the uniform (box) profile of the boron implant was converted into a tapered wedge profile in the SiC. Note that the convex mask shape shown in FIG. 6 resulted in a sub-linear (concave) taper in the termination dose. The total boron termination doses for the two quarters were $0.5\times10^{14}$ and $1.5\times10^{14}$ $cm^{-2}$, respectively.

After implantation, the tapered implantation mask was removed and the implanted quarters were annealed at 1650° C. protected by another carbon cap. Subsequent processing consisted of a 1 μm PEVCD oxide p-side passivation, a broad-area nickel ohmic n-contact, and patterned aluminum ohmic p-contacts. The n- and p-ohmic contacts were alloyed at 900° C. and 800° C., respectively. Patterning of gold probe pads on the p-contacts was the final process step.

Figure 7:
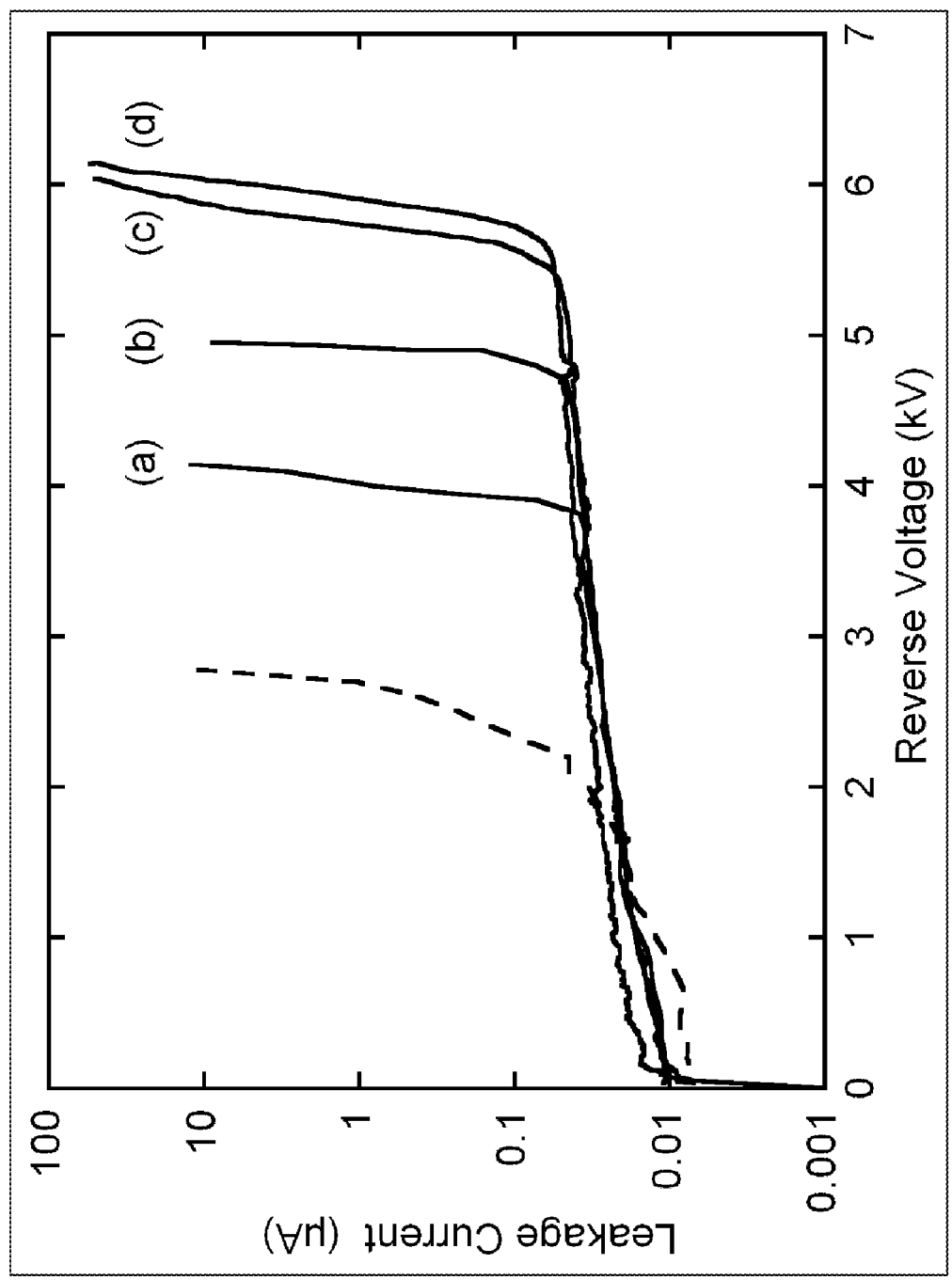
FIG. 7 is a plot showing reverse-bias diode performance for different boron implantation doses and carbon taper shapes in an exemplary implementation of a gray-scale lithography technique and tapered implantation mask in accordance with the present invention.

The implanted SiC PiN diodes were DC-tested as wafers at room temperature in reverse bias. This probe-testing was done in a FLUORINERT-filled basin with bed-of-pins for the backside contact. Reverse-bias test results for representative taper implanted PiN diodes are shown in FIG. 7. The best reverse breakdown performance was obtained from the diodes with $1.5\times10^{14}$ $cm^{-2}$ boron doping and a convex-taper implant mask. In this case the diodes routinely reached 6.1 kV with first indication of breakdown at about 5.8 kV. This behavior was non-destructive and did not depend strongly on the width of the termination from 200 to 500 μm. Below 200 μm termination width, the maximum breakdown voltage was reduced, with 100 μm terminations not exceeding 3.8 kV. Control diodes with no termination on the same wafer exhibited breakdown at voltages no higher than 2.7 kV and this breakdown was often destructive.

The performance of the other diode designs on the wafers was between these extremes. Many of the concave-taper implant-mask diodes with the $1.5\times10^{14}$ $cm^{-2}$ boron termination reached 6.1 kV, but the yield was half of that for the adjacent convex-masked devices. The performance of the $0.5\times10^{14}$ $cm^{-2}$ boron-implanted diodes was generally worse, with none of the tested parts reaching the 6.1 kV limit. The convex-tapered implant mask diodes with a $0.5\times10^{14}$ dose performed better, a few reaching 4.8 kV compared with a maximum of 4.0 kV for the concave-masked devices. Again the high-voltage performance and yield was best for termination widths wider than 200 μm.

Even without optimization, the termination performance for the higher-doped wafer in this exemplary implementation is competitive with much more complicated schemes. The breakdown suppression of this termination achieved through a simple one-step photolithography process reached over 90% of the ideal parallel-plane breakdown limit for the epitaxial i-layer in this punch-through diode design. To get this level of field termination in silicon carbide, it is customary to resort to multiple JTE implantation cycles, see J. B. Fedison et al., "Electrical characteristics of 4.5 kV implanted anode 4H—SiC P-I-N junction rectifiers," IEEE Electron. Device Lett., vol. 22, no. 3, pp. 130-132, 2001, or high resolution guard-ring lithography, see U.S. Pat. No. 7,026,650, "Multiple floating guard ring edge termination for silicon carbide devices," to S. H. Ryu et al. The diodes made with single-step, low-resolution photolithography in this study show termination performance comparable to these more complicated methods.

Details of the mask width, mask shape, termination dose, and termination dopant species are clearly important. The active boron doping achieved in the $0.5 \times 10^{14}$ cm$^{-2}$ wafer was too low to effectively terminate the diode anode and results from convex and concave implantation masks were different. In this study, for convenience, boron was used for the termination. Some slight diffusion and surface segregation is expected for boron, but the lateral movement is expected to be small compared with the width of the termination taper. In actual practice high-energy aluminum might be preferred for the termination, with the tapered implantation mask aligned to an epitaxial or Schottky contact.

Thus, the present invention provides a method for producing a junction termination extension having a sophisticated junction termination profile, with control over the lateral doping profile and lateral termination width, in a single photolithography step. This avoids the multiple cycles of photolithography and doping that are typical of competing techniques that only approximate a smoothly tapering termination profile. A tapered mask in accordance with the present invention can be obtained with simple, inexpensive photolithography masks and aligners, with the width of the taper being directly controlled by the width of the mask region having clear openings therein, and works with either a positive or a negative photoresist. If a transparent spacer is used to achieve resolution defocus, it ensures that the mask is held the required optical distance from the photoresist surface over the entire wafer, giving the tapered illumination that is required, and the hard-contact exposure achieves high yield even for wafers that are warped or tapered. However, one skilled in the art would appreciate that any suitable lithography tool operating conditions can be used to create diffusion of the light incident on the photoresist, and that the methods described herein are therefore not limited to use of a clear spacer or controlled gap to defocus the light on the photoresist.

Also, in accordance with the present invention, the shape of the taper can be directly controlled by the progressively increasing spacing between the clear areas. The spacing can also take into account the non-linear exposure-response of specific photoresist and the overlapping illumination in the inner regions where the slots are closely spaced, but once the desired profile is achieved, the taper shape is highly repeatable.

Although particular embodiments, aspects, and features have been described and illustrated, it should be noted that the invention described herein is not limited to only those embodiments, aspects, and features. It should be readily appreciated that these and other modifications may be made by persons skilled in the art, and the present application contemplates any and all modifications within the spirit and scope of the underlying invention described and claimed herein.

What is claimed is:

1. A method of fabricating a junction termination extension in an electronic, the junction termination extension having a controlled arbitrary lateral doping profile and a controlled arbitrary lateral width, comprising:

depositing a photosensitive material onto a semiconductor substrate, the semiconductor substrate including a junction termination zone;

exposing the photosensitive material to light through a mask containing a mask pattern of opaque and clear areas, a light flux image produced by the mask pattern of opaque and clear areas being projected onto the photosensitive material in an unresolved manner to obscure fine details in the opaque and clear areas of the mask pattern and provide a controlled laterally tapered profile and a controlled lateral width of light flux onto the photosensitive material;

developing the photosensitive material in a solution wherein the photosensitive material dissolves at a rate proportional to an amount of light flux absorbed during the exposure to produce a laterally tapered dopant mask having a controlled laterally tapered thickness profile with controlled lateral width corresponding to the controlled laterally tapered profile and the controlled lateral width of light flux onto the photosensitive material; and introducing dopants into the semiconductor substrate to produce the junction termination extension in the electronic device, the dopants in the semiconductor having the controlled laterally tapered thickness profile and controlled lateral width of the dopant mask and the electronic device comprising a terminal operatively connected to the junction termination extension, the junction termination extension being aligned with the terminal.

2. The method of claim 1, wherein the mask is separated from the photosensitive material by a layer of ultraviolet-transparent spacer material.

3. The method of claim 1, wherein the mask is separated from the photosensitive material by a gap of controlled width.

4. The method of claim 1, wherein the light comprises one of ultraviolet, violet, and blue light.

5. The method of claim 1, further comprising annealing the photosensitive material to convert the photosensitive material into a carbon film on the semiconductor substrate.

6. The method of claim 5, further comprising converting the photosensitive material to graphite.

7. The method of claim 1, wherein the laterally tapered dopant mask comprises an ion implantation mask, the method further comprising implanting dopant ions through the implantation mask to produce a controlled arbitrary lateral doping profile in the semiconductor.

8. The method of claim 7, wherein the ion implantation is performed at a plurality of energies and doses to produce an approximately uniform lateral doping profile in the semiconductor.

9. The method of claim 7, wherein the ion implantation is performed at high energies to produce a buried depth profile over at least one inner region of the junction termination zone.

10. The method of claim 1, wherein the laterally tapered dopant mask comprises a diffusion mask, the method further comprising diffusing dopant atoms through the diffusion mask into the semiconductor substrate to produce a controlled arbitrary lateral doping profile in the semiconductor.

11. The method of claim 1, wherein the laterally tapered dopant mask comprises an etching mask, the method further comprising etching an existing dopant layer disposed on the semiconductor substrate following the etching mask to produce a controlled arbitrary lateral doping profile in the semiconductor.

12. The method of claim 11, further comprising transferring a tapered mask pattern of the etching mask into another material to form a tapered layer before etching the existing dopant layer on the semiconductor substrate and using the tapered layer as an etch mask for the semiconductor.

13. The method of claim 12, further comprising transferring the tapered mask pattern into a dielectric layer such as silicon dioxide to form a tapered dielectric layer and using the tapered dielectric layer as the etch mask for the semiconductor.

14. The method of claim 1, wherein the laterally tapered dopant mask comprises a positive photoresist.

15. The method of claim 1, wherein the laterally tapered dopant mask comprises a negative photoresist.

16. The method of claim 1, wherein the mask pattern is smoothly adjusted from an inner edge to an outer edge of the junction termination zone.

17. The method of claim 1, wherein the mask pattern is adjusted in steps from an inner edge to an outer edge of the junction termination zone.

18. The method of claim 1, wherein the mask pattern comprises a plurality of two-dimensional geometrical figures having a size and a spacing thereof adjusted from an inner edge to an outer edge of the junction termination zone.

19. The method of claim 1, wherein the mask pattern comprises a plurality of concentric rings having at least one of a spacing and a width adjusted from an inner edge to an outer edge of the junction termination zone.

20. The method of claim 1 wherein the mask pattern comprises a plurality of radial features having at least one of a spacing and a width adjusted from an inner edge to an outer edge of the junction termination zone.

21. The method of claim 1, wherein the terminal comprises an epitaxially grown layer on the semiconductor substrate.

22. The method of claim 1, wherein the terminal comprises one of a metal and an electrically conductive polysilicon.

23. The method of claim 1, wherein the terminal is co-implanted into the semiconductor substrate simultaneously with the dopant ions, the terminal being self-aligned with the controlled arbitrary lateral doping profile in the semiconductor substrate due to the co-implantation.

24. The method of claim 1, wherein the terminal comprises dopant aluminum ions and the junction termination extension comprises dopant boron ions, an implantation of the boron ions being deeper than an implantation of the dopant aluminum ions.

25. The method of claim 24, wherein the terminal is co-diffused into the semiconductor substrate simultaneously with the dopant ions, the terminal being self-aligned with the controlled arbitrary lateral doping profile in the semiconductor substrate due to the co-diffusion.

26. The method of claim 1, wherein the semiconductor substrate comprises silicon carbide.

* * * * *